(12) United States Patent
Namuduri et al.

(10) Patent No.: US 11,071,225 B2
(45) Date of Patent: Jul. 20, 2021

(54) SMART HIGH-VOLTAGE RELAY

(71) Applicant: GM GLOBAL TECHNOLOGY OPERATIONS LLC, Detroit, MI (US)

(72) Inventors: Chandra S. Namuduri, Troy, MI (US); Rashmi Prasad, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 89 days.

(21) Appl. No.: 16/656,084

(22) Filed: Oct. 17, 2019

(65) Prior Publication Data

US 2021/0120693 A1 Apr. 22, 2021

(51) Int. Cl.
*H05K 7/02* (2006.01)
*H02H 9/00* (2006.01)
*H02M 1/34* (2007.01)
*H02M 1/08* (2006.01)
*H01L 25/16* (2006.01)

(52) U.S. Cl.
CPC ............ *H05K 7/02* (2013.01); *H01L 25/16* (2013.01); *H02H 9/00* (2013.01); *H02M 1/08* (2013.01); *H02M 1/34* (2013.01)

(58) Field of Classification Search
CPC ............ H05K 7/02; H01L 25/16; H02H 9/00; H02M 1/08; H02M 1/34
USPC ........................................................ 361/91.7
See application file for complete search history.

(56) References Cited

U.S. PATENT DOCUMENTS

| | | | |
|---|---|---|---|
| 10,932,343 B2* | 2/2021 | Reed | H01H 9/54 |
| 2011/0134607 A1* | 6/2011 | Schnetker | H01L 25/072 361/709 |
| 2018/0006445 A1* | 1/2018 | Weaver | H01H 47/002 |
| 2018/0182750 A1* | 6/2018 | Burke | H01L 29/1095 |
| 2019/0056131 A1* | 2/2019 | Warren | F24F 11/89 |
| 2020/0161062 A1* | 5/2020 | Muri | H01H 9/548 |
| 2020/0365346 A1* | 11/2020 | Telefus | H01H 9/56 |

* cited by examiner

*Primary Examiner* — Yemane Mehari
(74) *Attorney, Agent, or Firm* — Quinn IP Law

(57) ABSTRACT

An integrated smart relay assembly includes a case and an electronic solid-state switch disposed inside the case and a gate driver circuit electrically connected to the electronic solid-state switch. The gate driver circuit is configured to drive the electronic solid-state switch with a predetermined gate voltage and a predetermined gate current. The relay assembly further includes a protection circuit electrically connected to the gate driver circuit. The protection circuit is configured to protect the electronic solid-state switch against over-voltage, short circuit, and overheating. The relay assembly further includes a communication interface integrated with the electronic solid-state switch. Each of the protection circuit, electronic solid-state switch, and the communication interface is disposed inside the case.

19 Claims, 7 Drawing Sheets

SMART HIGH-VOLTAGE RELAY

INTRODUCTION

The present disclosure relates to a smart high-voltage solid-state relay in a relay assembly.

If a solid-state switch module is used to completely replace a contactor, it is desirable for this switch module to include driving circuits, protections circuits, sensing circuits, communications circuits, fault logic, and power supply. Externally assembled functions to support the switch module are very application specific and increase cost, complexity and space.

SUMMARY

It is therefore desirable to develop a relay assembly integrally which includes driving circuits, protections circuits, sensing circuits, communications circuits and a power supply in order to minimize the cost and complexity of controlling the different relay functions and occupied volume by integrating these functions together cost effectively. In an aspect of the present disclosure, a relay assembly includes a case and an electronic solid-state switch disposed inside the case and a gate driver circuit electrically connected to the electronic solid-state switch. The gate driver circuit is configured to drive the electronic solid-state switch with a predetermined gate voltage and a predetermined gate current. The relay assembly further includes a protection circuit electrically connected to the gate driver circuit. The protection circuit is configured to protect the electronic solid-state switch against over-voltage, short circuit, over-current, and overheating. The relay assembly further includes a communication interface (e.g., a controller area network (CAN) bus interface) integrated with the electronic solid-state switch. Each of the protection circuit, electronic solid-state switch, and the communication interface (e.g., CAN bus interface) is disposed inside the case.

The relay assembly may further include a plurality of sensors electrically coupled to the electronic solid-state switch. The sensors may be configured to measure a current, a voltage and a temperature in the relay assembly. The sensors may include a current sensor, a voltage sensor, and a temperature sensor. The relay assembly may further include fault logic and feedback for switch diagnostics integrated within the smart relay assembly.

Each of the gate driver circuit, the protection circuit, the sensors, and the CAN may be entirely disposed inside the case. The gate driver circuit may be disposed outside the case but very close to the switch terminals to have direct press fit configuration of the gate leads onto the switch module, thereby ensuring minimum inductance in the circuit. The gate driver circuit may include a plurality of leads. The case may have a plurality of holes. Each of the holes is sized to receive a respective lead in a press-fit configuration.

The protection circuit may include a snubber circuit electrically connected to the electronic solid-state switch. The snubber circuit may be entirely disposed inside the case. The snubber circuit includes an RC circuit and a transient voltage suppressor electrically connected in parallel with the RC circuit. Alternatively, the snubber circuit may include an RC circuit. The RC circuit may include a resistor and a capacitor electrically connected in series with the resistor.

The relay assembly may include an interposer, which may be which may be high temperature ceramic or silicon. The gate driver circuit may be disposed on the interposer making connections to the gate pad of the semiconductor device through vias or contact pins. The encapsulant in the relay assembly may entirely encapsulate the electronic solid-state switch. The interposer may support the gate driver circuit.

The relay assembly may include a direct bonded substrate. The electronic solid-state switch dies may be directly disposed on the direct bonded substrate. The gate driver chip in the bare die form may be directly disposed on the direct bonded substrate close to the switch dies for minimizing parasitic inductance. The relay assembly may further include a power supply entirely disposed inside the case. The power supply may be electrically connected to the electronic solid-state switch and will help the solid-state switch relay to be self-powered.

The above features and advantages, and other features and advantages, of the present teachings are readily apparent from the following detailed description of some of the best modes and other embodiments for carrying out the present teachings, as defined in the appended claims, when taken in connection with the accompanying drawings.

DETAILED DESCRIPTION

The following detailed description is merely exemplary in nature and is not intended to limit the application and uses. Furthermore, there is no intention to be bound by expressed or implied theory presented in the preceding introduction, summary or the following detailed description.

Embodiments of the present disclosure may be described herein in terms of functional and/or logical block components and various processing steps. It should be appreciated that such block components may be realized by a number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that alternative or additional functional relationships or physical connections may be present in an embodiment of the present disclosure.

Figure 1:
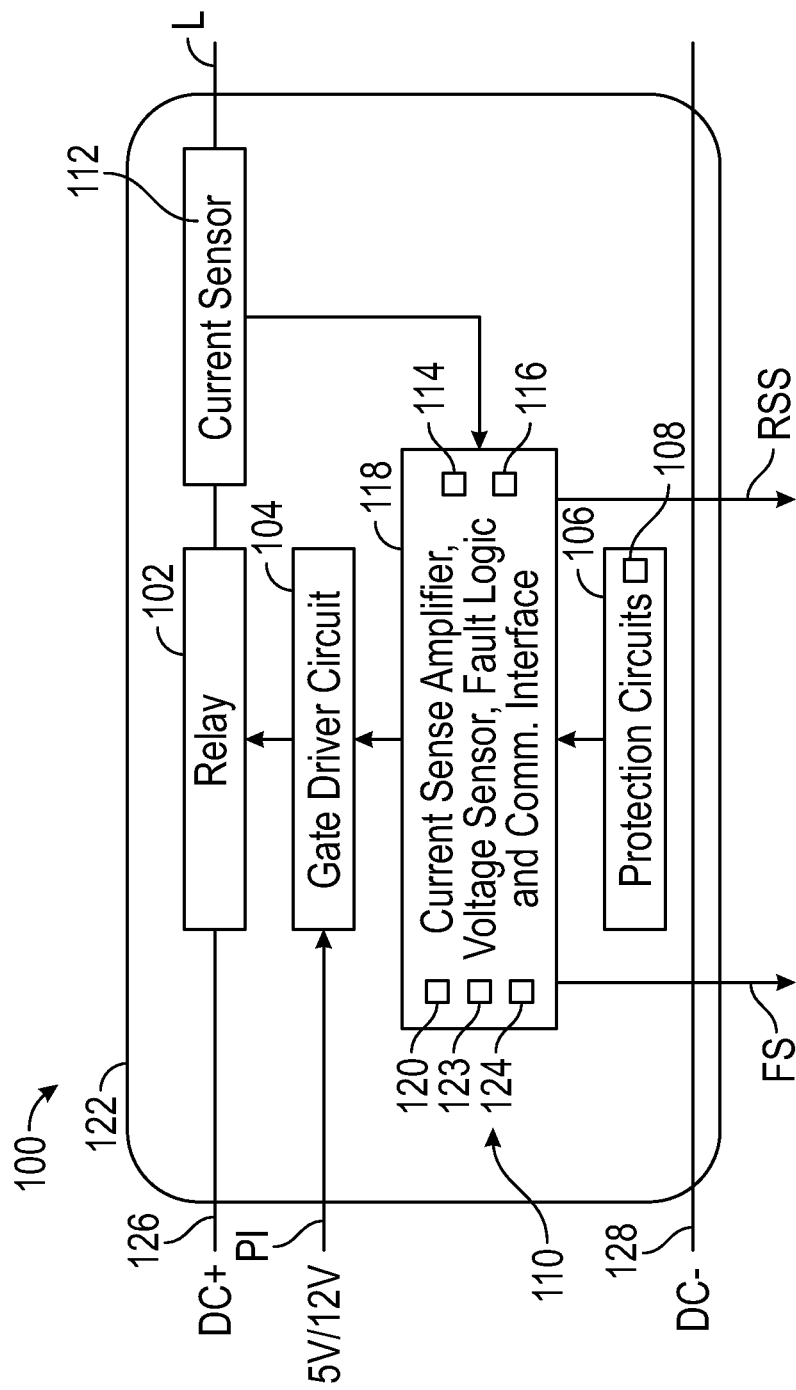
FIG. 1 is a schematic diagram of a relay assembly including an electronic solid-state switch, a gate driver circuit, protection circuits, sensing circuits and fault logic with a communication interface electrically connected to the electronic solid-state switch.
Figure 2A:
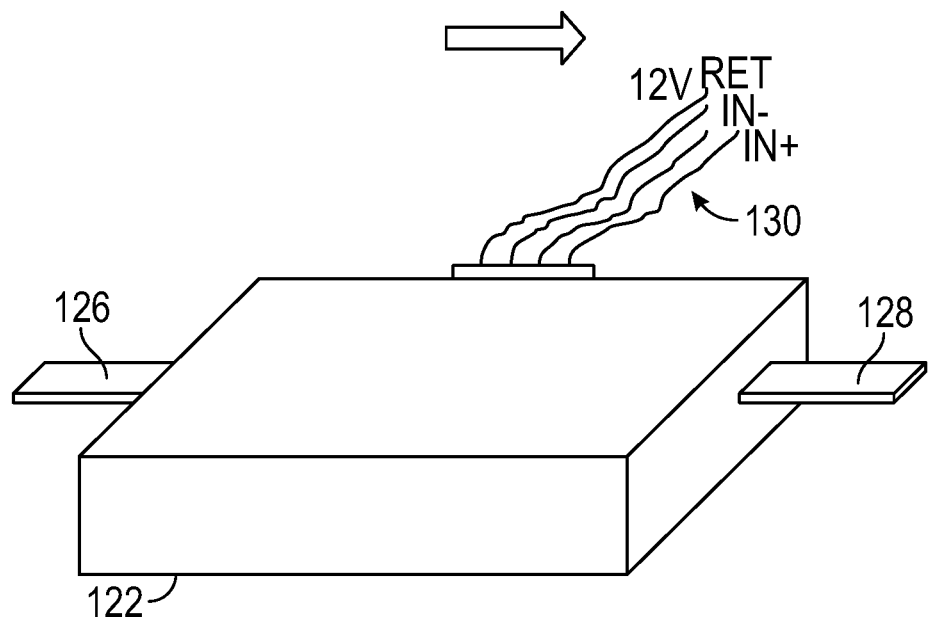
FIG. 2A is a schematic perspective view of the relay assembly of FIG. 1.
Figure 2B:
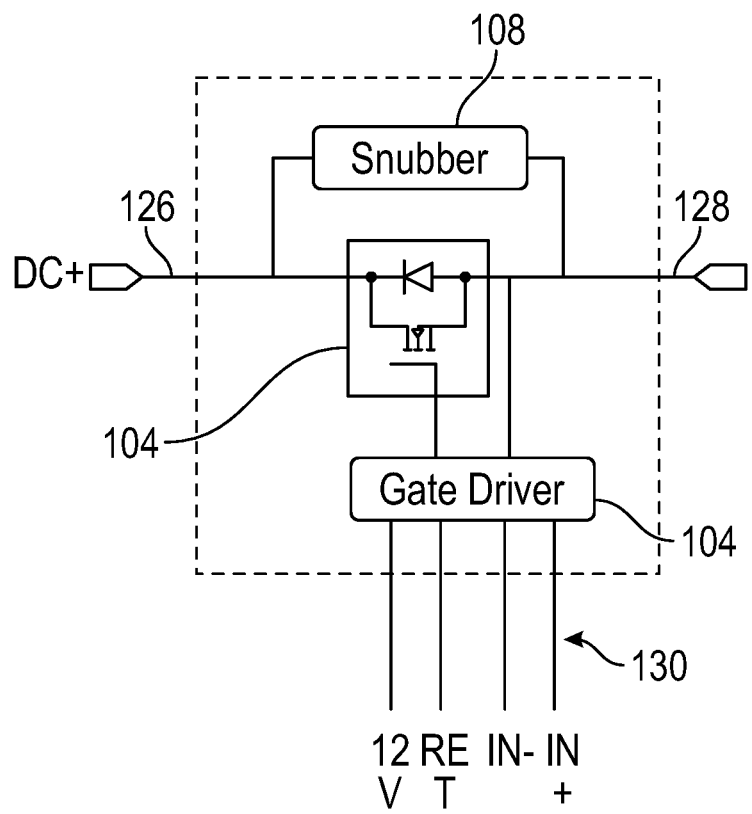
FIG. 2B is an electrical diagram of a part of the relay assembly of FIG. 1.
Figure 2C:
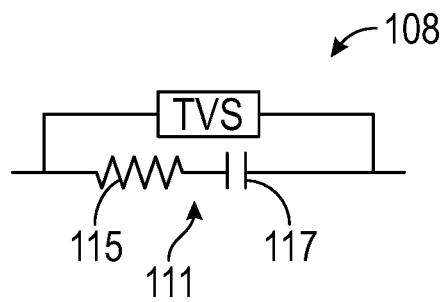
FIG. 2C is an electrical diagram of a snubber circuit of the relay assembly of FIG. 1, wherein the snubber circuit includes a transient voltage suppressors (TVS).
Figure 2D:
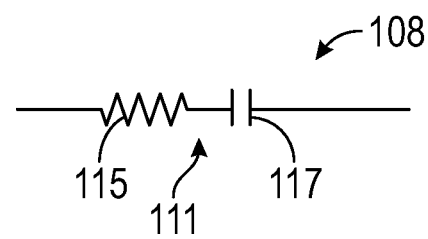
FIG. 2D is an electrical diagram snubber relay assembly of FIG. 1, wherein the snubber circuit includes an RC circuit.

With reference to FIGS. 1-2D, a smart relay assembly 100 includes an electronic solid-state switch 102 and a gate driver circuit 104. The electronic solid-state relay 100 may be a semiconductor field-effect transistor (MOSFET). The MOSFET may include silicon carbide or other suitable semiconductors materials, such as Silicon, Gallium Nitride, and Gallium Oxides. The gate driver circuit 104 is a power amplifier that accepts a lower-power input PI (e.g., 5 volts and/or 12 volts) and produces a high-current drive input for the gate of the electronic solid-state switch 102. Accordingly, the gate driver circuit 104 is electrically connected to the electronic solid-state switch 102. The gate driver circuit is configured to drive the electronic solid-state switch 102 with appropriate gate voltages and currents.

The relay assembly 100 may further include a plurality of sensors 110 electrically connected to the electronic solid-state switch 102 to supply gate signals to switch the MOSFET on or off. The sensors 110 are used for diagnosis and are configured to measure, for example, current, voltage, and/ PR temperature of the relay assembly 100. For instance, the relay assembly 100 may include a current sensor 112 configured to measure the current (i.e., amperage) in the electronic solid-state switch 102. In addition to the current sensor 112, the relay assembly 100 may include a voltage sensor 116 configured to measure the voltage accords the power terminals of the electronic solid-state switch 102. Further, the relay assembly 100 includes one or more temperature sensors 148 to measure the temperature of the electronic solid-state switch 102. The current sensor 112 may be electrically connected to a load L.

The relay assembly 100 further includes one or more dedicated protection circuits 106 configured to protect the electronic solid-state switch 102 against the overvoltage, short circuit, and/or overheating. The protection circuits 106 may include a snubber circuit 108 electrically connected to the electronic solid-state switch 102 to allow switching of the rated current from the voltage supply 202 (which has a predetermined inductance) in less than 0.5 milliseconds (e.g., less than 0.2 milliseconds) while minimizing transient voltage across the electronic solid-state switch 102. The snubber circuit 108 is configured to absorb energy and prevent oscillations in voltage and current due to parasitic capacitances. As shown in FIG. 2B, the snubber circuit 108 may be electrically connected in parallel with the electronic solid-state switch 102. As shown in FIG. 2C, the snubber circuit may have one or more transient voltage suppressors (TVS) 109, such as Zener diode, electrically connected in parallel with a damping resistor-capacitor circuit (RC circuit) 111 of predetermined thresholds. The RC circuit 111 includes a resistor 115 electrically connected in series with a capacitor 117. Alternatively, as shown in FIG. 2D, the snubber circuit 108 may solely include a RC circuit 11 electrically connected across the power terminals of the electronic solid-state switch 102.

The relay assembly 100 further includes a module 118 including a current sense amplifier 120, a fault logic circuit 114, and a voltage sensor 116. The voltage sensor 116 is configured to measure the voltage across the power terminals of the electronic solid-state switch 102. The fault logic circuit 114 is configured to output a fault signal FS (indicating a fault condition in the electronic solid-state switch 102). Further, the fault logic circuit 114 is configured to output a relay status signal RSS (which indicative of the status of the electronic solid-state switch 102). The module 118 is electrically connected to the electronic solid-state switch 102 through the gate driver circuit 104.

Figure 3:
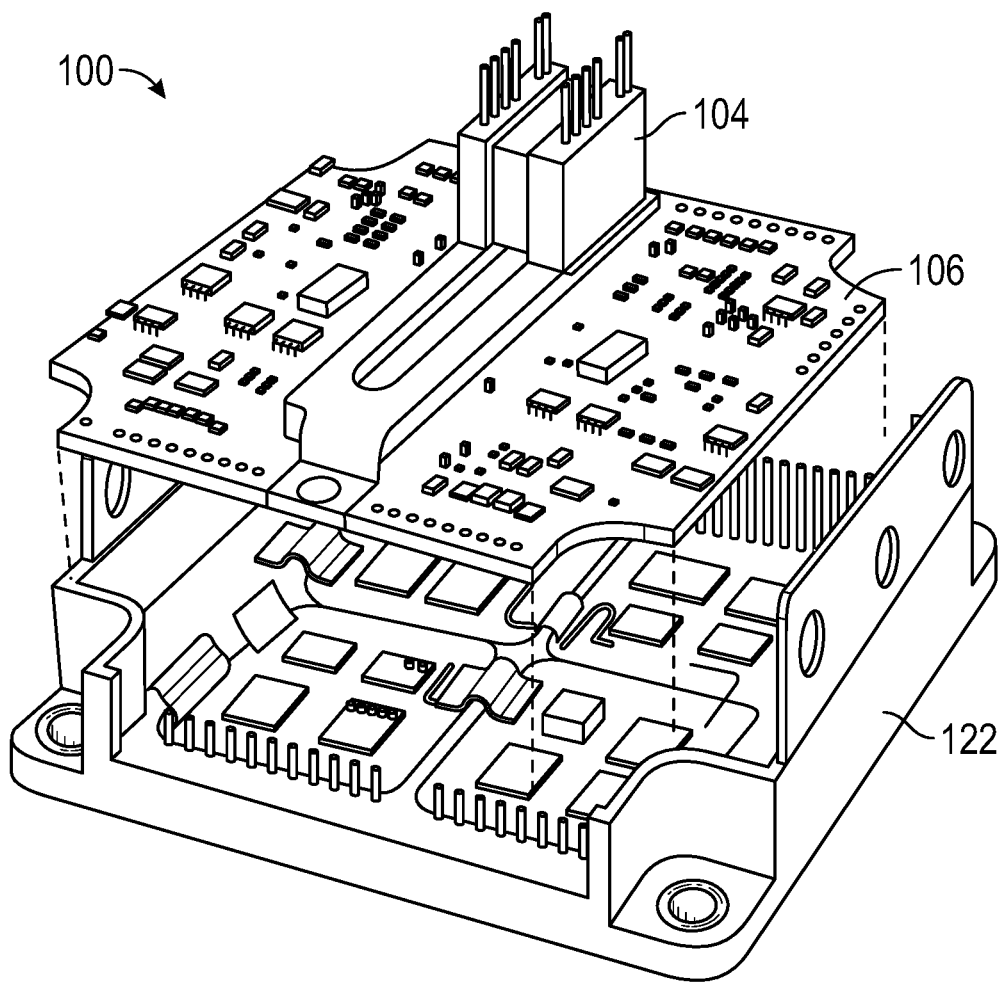
FIG. 3 is a schematic, exploded view of the relay of FIG. 1, wherein the protection circuits are disposed inside a case.

The module 118 further includes a communication interface 124, such as a controller area network (CAN) bus interface, electrically connected to the electronic solid-state switch 102. As in FIG. 2A, the relay assembly 100 includes a positive terminal 126 (DC+) and a negative terminal 128 (DC−) electrically connected to the electronic solid-state switch 102 and protruding directly from the case 122. The terminals 130 of the gate driver circuit 104 extend directly from the case 122. As shown in FIGS. 2 and 3, the protection circuits 106 and the gate driver circuit 104 may be entirely disposed inside the case 122 for protection and to minimize the size of the relay assembly 100. The electronic solid-state switch 102, the sensors 110, the module 118, the protection circuits 106, and the gate driver circuits 104 may be entirely disposed inside the case 122 to minimize the space occupied by the relay assembly 100.

Figure 4:
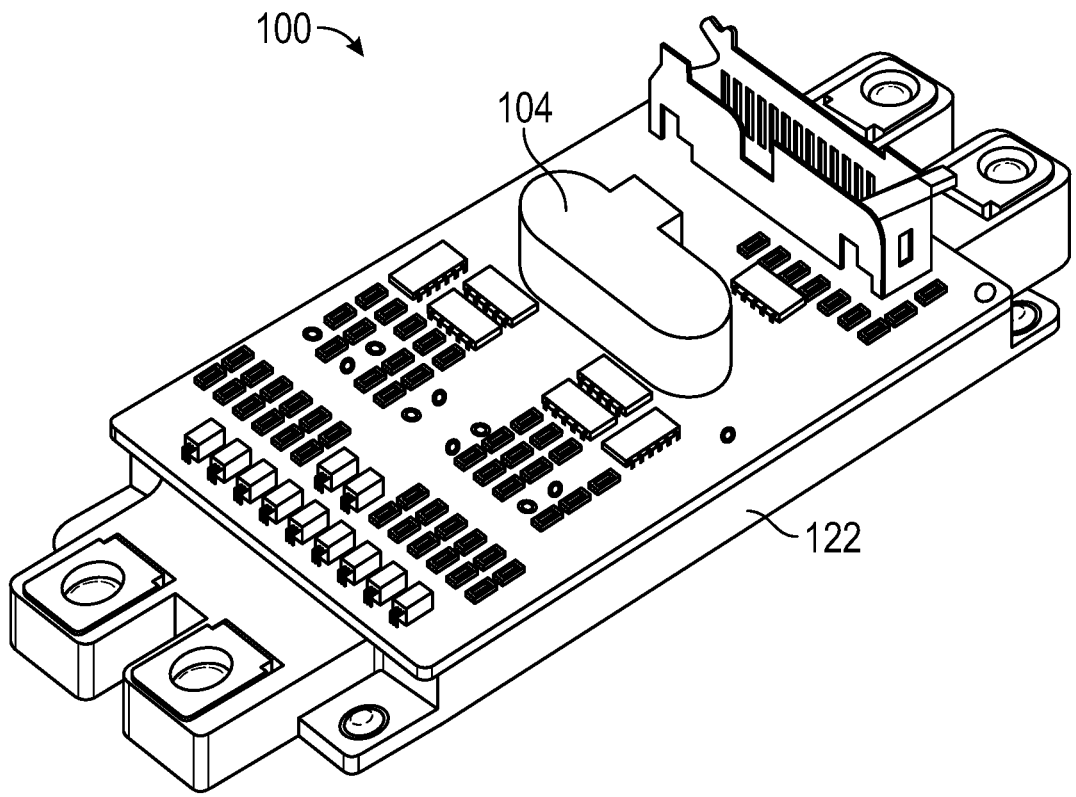
FIG. 4 is a schematic perspective view of the relay assembly of FIG. 1, wherein the gate driver circuit is mounted outside the case using very short lead connections or solderless press-fit connections.
Figure 5:
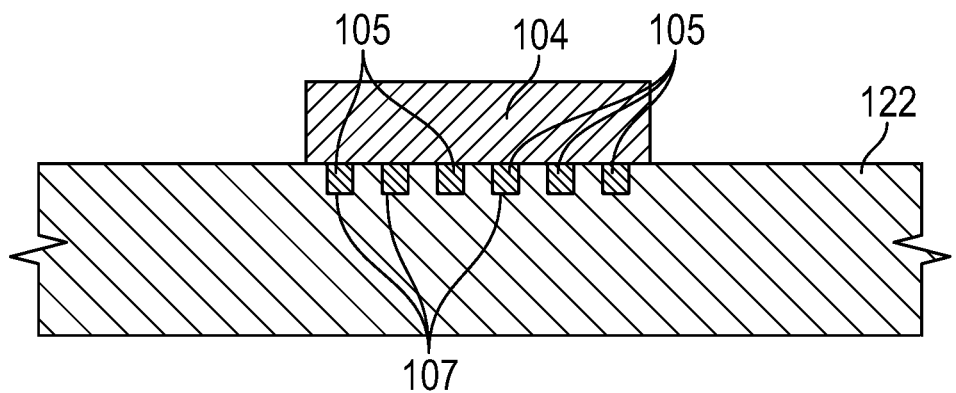
FIG. 5 is a schematic, sectional, partial view of the relay assembly shown in FIG. 4.

With reference to FIGS. 4 and 5, the gate driver circuit 104 is disposed outside the case 122. The gate driver circuit 104 includes a plurality of leads 105 that are press-fit into the case 122. The case 122 may have holes 107 that are each sized to receive one of the respective leads 105 in a press-fit configuration. The leads 105 may be very short to enable a press-fit connection between the case 122 and the gate driver circuit 104, thereby minimizing the parasitic inductance and size of the relay assembly 100.

Figure 6:
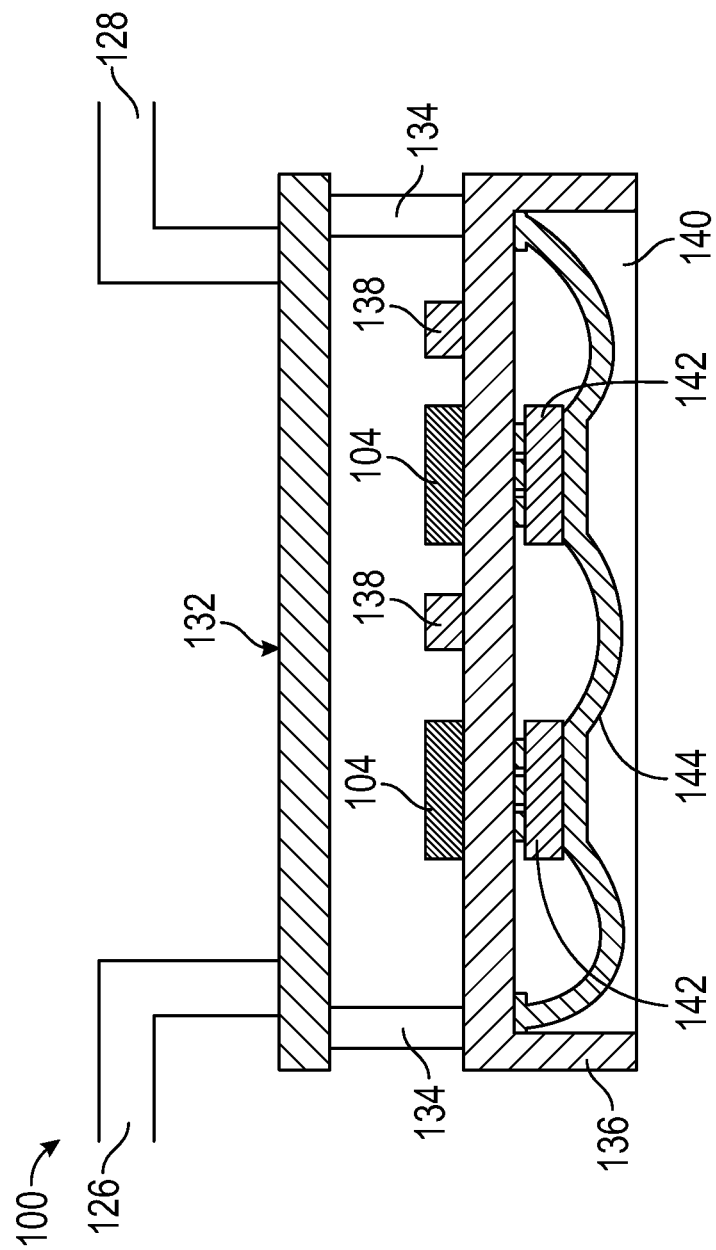
FIG. 6 is a schematic, front view of a relay assembly including an interposer to support the switch die and gate driver attached within the case.

With reference to FIG. 6, the positive terminal 126 and the negative terminal 128 of the relay assembly 100 are electrically connected to a control board 132. The relay assembly 100 may further include one or more interconnects 134 coupling the control board 132 to an interposer 136. The interposer 136 supports one or more gate driver circuits 104 and one or more passive electronic components 138. An encapsulant 140 may be disposed inside the relay assembly 100. The encapsulant 140 encapsulates one or more power devices 142, such as the electronic solid-state switch 102, and one or more interconnects (e.g., flexible metal foil 144). The metal foils 144 electrically connect the power devices 142 to each other. A heat sink may be coupled to the encapsulate 140 for thermal management.

Figure 7:
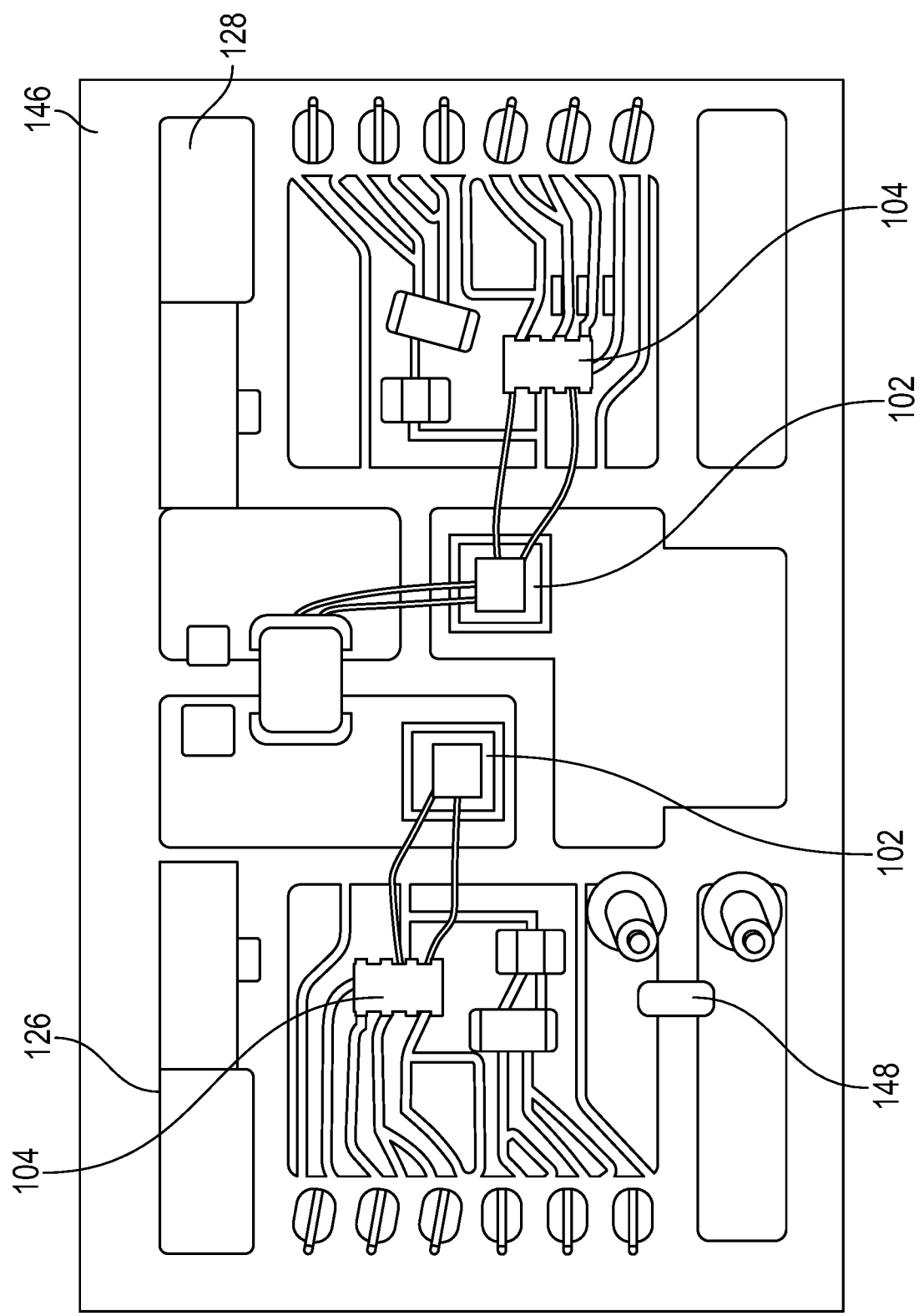
FIG. 7 is a relay assembly including a gate driver chip on a direct bonded substrate, such as direct bonded copper (DBC) substrate or a direct bonded aluminum (DBA) substrate.

With reference to FIG. 7, the relay assembly 100 may include a direct bonded substrate 146, such as direct bonded copper (DBC) substrate or a direct bonded aluminum (DBA) substrate. One or more of the electronic solid-state switches 102 (e.g., MOSFET) may be directly disposed on the direct bonded substrate 146 to minimize the size of the relay assembly 100. One or more temperature sensors 148, such as thermistors, may be disposed directly on the direct bonded substrate 146 to minimize the size of the relay assembly 100. The positive terminal 126 and the negative terminal 128 may be configured as metallic traces disposed directly on the direct bonded substrate 146 to minimize the size of the relay assembly 100. The gate driver circuits 104 are configured as chips in die form that are directly disposed on the direct bonded substrate 146 to minimize inductance.

Figure 8:
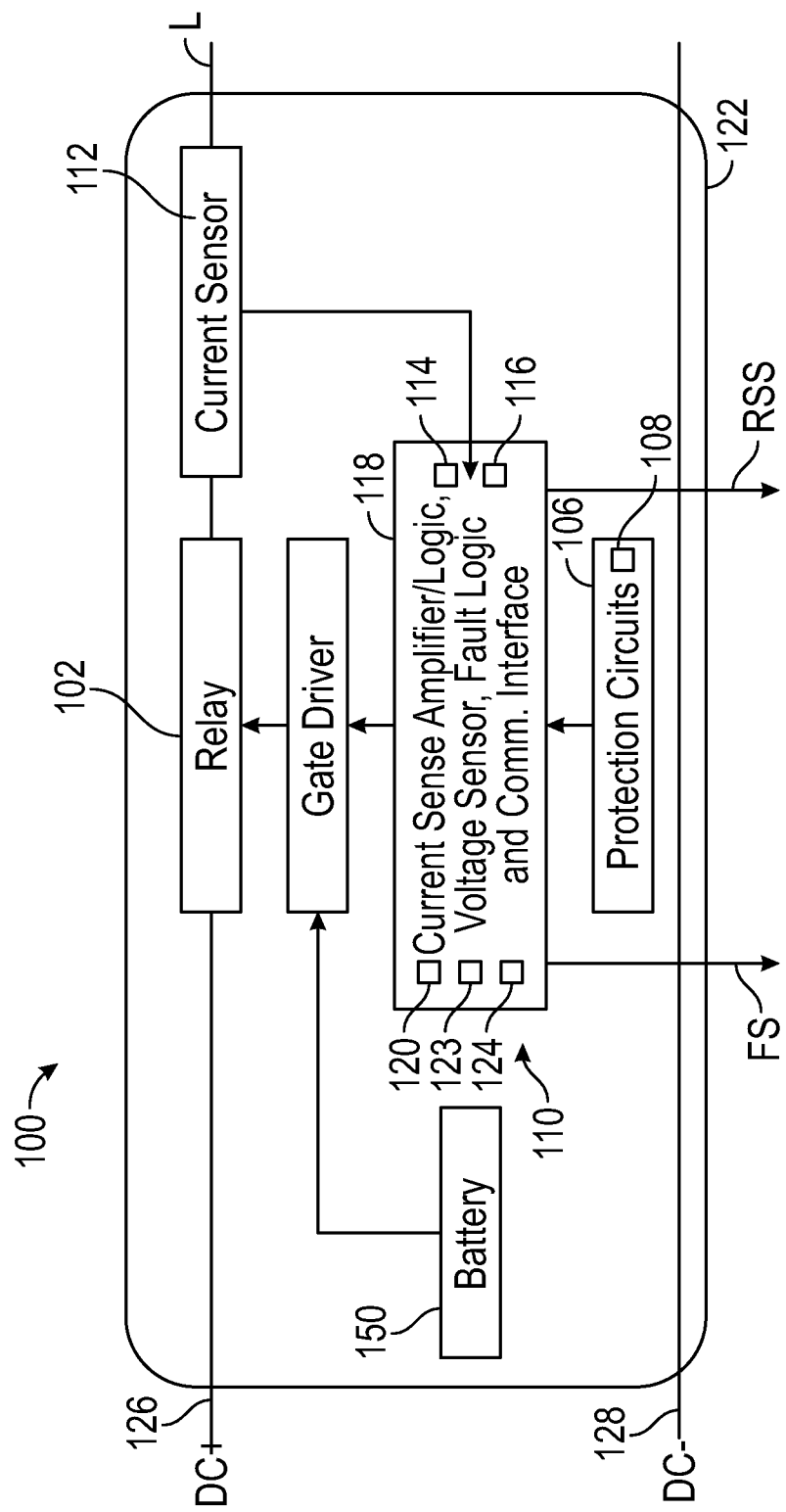
FIG. 8 is a schematic diagram of a relay assembly including a power device.

With reference to FIG. 8, the relay assembly 100 may be self-powered. To this end, the relay assembly 100 incudes a local power supply 150, such as a battery, entirely disposed inside the case 122. The power supply 150 is electrically connected to the module 118 to supply power to the relay assembly 100, thus eliminating the need for external power supply signals for the gate driver as in FIG. 1.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. For instance, the embodiments shown in FIGS. 3-7 are mere examples and are not necessarily the only way to integrate the functions and the gate driver into a single relay assembly case.

What is claimed is:

1. An integrated smart relay assembly, comprising:
   a case;
   an electronic solid-state switch disposed inside the case;
   a gate driver circuit electrically connected to the electronic solid-state switch, wherein the gate driver circuit is configured to drive the electronic solid-state switch with a predetermined gate voltage and a predetermined gate current;
   a protection circuit electrically connected to the gate driver circuit, wherein the protection circuit is configured to protect the electronic solid-state switch against over-voltage, short circuit, and thermal runaway;
   a communication interface integrated with the electronic solid-state switch; and
   wherein each of the protection circuit, the electronic solid-state switch, and the communication interface is disposed inside the case;
   wherein the gate driver circuit includes a plurality of leads, the case has a plurality of holes, and each of the plurality of holes is sized to receive a respective one of the plurality of leads in a press-fit configuration.

2. The relay assembly of claim 1, further comprising a plurality of sensors electrically coupled to the electronic solid-state switch, wherein the plurality of sensors is configured to measure a current, a voltage and a temperature in the relay assembly.

3. The relay assembly of claim 2, wherein the plurality of sensors includes a current sensor configured to measure a current in the relay assembly, a voltage sensor configured to measure a voltage in the relay assembly, and a temperature sensor configured to measure a temperature in the relay assembly.

4. The relay assembly of claim 2, wherein each of the gate driver circuit, the protection circuit, the plurality of sensors, and the communication interface is entirely disposed inside the case.

5. The relay assembly of claim 1, wherein the gate driver circuit is partly disposed outside the case.

6. The relay assembly of claim 1, wherein the protection circuit incudes a snubber circuit electrically connected to the electronic solid-state switch, the snubber circuit is entirely disposed inside the case, and the snubber circuit includes an RC circuit and a transient voltage suppressor electrically connected in parallel with the RC circuit.

7. The relay assembly of claim 1, wherein the protection circuit incudes a snubber circuit electrically connected to the electronic solid-state switch, the snubber circuit is entirely disposed inside the case, the snubber circuit includes an RC circuit, and the RC circuit includes a resistor and a capacitor electrically connected in series with the resistor.

8. The relay assembly of claim 1, further comprising an interposer that supports the gate driver circuit.

9. The relay assembly of claim 1, further includes a direct bonded substrate, the electronic solid-state switch is directly disposed on the direct bonded substrate, and the gate driver circuit is configured as a chip in a die form and is directly disposed on the direct bonded substrate.

10. The relay assembly of claim 1, further comprising a local power supply entirely disposed inside the case, and the local power supply is electrically connected to the electronic solid-state switch such that the relay assembly is self-powered.

11. An integrated smart relay assembly, comprising:
    a case;
    an electronic solid-state switch disposed inside the case;
    a gate driver circuit electrically connected to the electronic solid-state switch, wherein the gate driver circuit is configured to drive the electronic solid-state switch with a predetermined gate voltage and a predetermined gate current;
    a protection circuit electrically connected to the gate driver circuit, wherein the protection circuit is configured to protect the electronic solid-state switch against over-voltage, short circuit, and overheating;
    a communication interface integrated with the electronic solid-state switch;
    a plurality of sensors electrically coupled to the electronic solid-state switch, wherein the plurality of sensors includes a current sensor configured to measure a current in the relay assembly, the plurality of sensors includes a voltage sensor configured to measure a voltage in the relay assembly, and the plurality of sensors includes a temperature sensor configured to measure a temperature in the relay assembly; and
    wherein each of the protection circuit, the electronic solid-state switch, and the communication interface is disposed inside the case;
    wherein the gate driver circuit includes a plurality of leads, the case has a plurality of holes, and each of the plurality of holes is sized to receive a respective one of the plurality of leads in a press-fit configuration.

12. The relay assembly of claim 11, wherein each of the gate driver circuit, the protection circuit, the plurality of sensors, and the communication interface is entirely disposed inside the case.

13. The relay assembly of claim 11, wherein the gate driver circuit is partly disposed outside the case.

14. The relay assembly of claim 11, wherein the protection circuit incudes a snubber circuit configured electrically connected to the electronic solid-state switch, and the snubber circuit is entirely disposed inside the case, and the snubber circuit includes an RC circuit and a transient voltage suppressor electrically connected in parallel with the RC circuit.

15. The relay assembly of claim 11, wherein the protection circuit incudes a snubber circuit electrically connected to the solid-state switch, and the snubber circuit is entirely disposed inside the case, the snubber circuit includes an RC circuit, and the RC circuit includes a resistor and a capacitor electrically connected in series with the resistor.

16. The relay assembly of claim 11, further comprising an interposer and an encapsulate disposed inside the interposer, the gate driver circuit is disposed on the interposer.

17. The relay assembly of claim 16, wherein the encapsulant entirely encapsulates the electronic solid-state switch, and the interposer supports the gate driver circuit.

18. The relay assembly of claim 11, further includes a direct bonded substrate, the electronic solid-state switch is directly disposed on the direct bonded substrate, and the gate driver circuit is configured as a chip and is directly disposed on the direct bonded substrate.

19. The relay assembly of claim 11, further comprising a power supply entirely disposed inside the case, and the power supply is electrically connected to the electronic solid-state switch.

* * * * *